(12) United States Patent
Chang (10) Patent No.: US 6,960,789 B2
(45) Date of Patent: Nov. 1, 2005

(54) LAYOUT OF A THIN FILM TRANSISTOR AND THE FORMING METHOD THEREOF

(75) Inventor: Ming-Hsuan Chang, San-Chung (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 0 days.

(21) Appl. No.: 10/718,674

(22) Filed: Nov. 24, 2003

(65) Prior Publication Data

US 2005/0110048 A1 May 26, 2005

(51) Int. Cl.⁷ .............................................. H01L 21/82
(52) U.S. Cl. ........................... 257/59; 257/55; 257/57; 257/72; 257/339; 349/38
(58) Field of Search ............................. 257/55, 57, 59, 257/66, 71, 72, 88, 292, 336, 339, 347, 350, 257/352, 448; 349/38–44, 46

(56) References Cited

U.S. PATENT DOCUMENTS 4,600,274 A * 7/1986 Morozumi ................... 349/109
4,859,623 A * 8/1989 Busta ........................... 438/30

\* cited by examiner

*Primary Examiner*—Minhloan Tran
*Assistant Examiner*—Thomas L. Dickey
(74) *Attorney, Agent, or Firm*—Rosenberg, Klein & Lee (57) ABSTRACT

A transistor that at least has one of the following characteristics: First, the gate electrode is located outside the gate line, such that the whole transistor is located outside the gate line. Second, the projection of the semiconductor layer on the substrate is totally located inside the projection of the gate electrode on the substrate. Third, the drain cross the gate electrode, such that the projection of the cross-section is totally located inside the projection of the gate electrode. Final, the separated distance between the gate line, the gate electrode, the drain and the source is adjusted to let the variation of each of Cgd and Cds be not obviously affected by the alignment deviation.

5 Claims, 9 Drawing Sheets

LAYOUT OF A THIN FILM TRANSISTOR AND THE FORMING METHOD THEREOF

BACKGROUND OF THE INVENTION

1. Field of the Invention

The present invention relates to the layout of a transistor, particularly to the layout of a Thin Film Transistor (TFT) and the method of implementing the same.

2. Description of the Prior Art

Figure 1A:
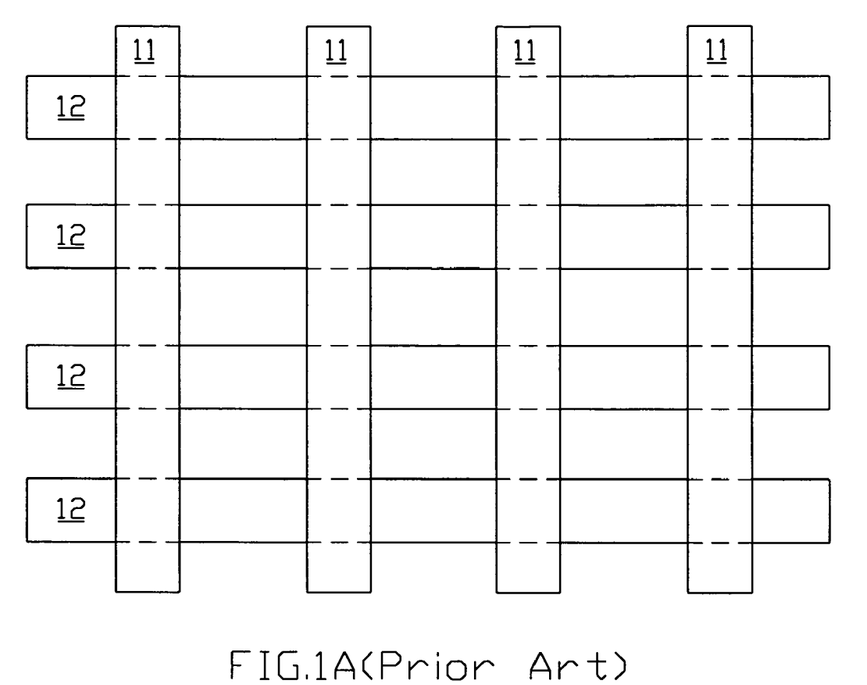
FIG. 1A to 1H showing the layout and the defect of the transistor normally seen in the well-known art.

In electronic products nowadays, the using of transistors often comes in the type of an array instead of a single one, for example, the memory array shown in FIG. 1A, comprising the conducting lines 11 and the conducting lines 12 interlaced, wherein any of the conducting line 11 connecting with a plurality of gate electrodes, any of the conducting line 12 connecting with a plurality of source and drain electrodes, making the source/drain electrodes of adjacent transistors relative to each other. Another example is the array shown in FIG. 1B, formed by the conducting lines 13, 14, and the conductors 15, with the conducting lines 13 and 14 interlaced with each other; the salient of the conducting line 13, the conducting line 14, along with the conductor 15 next to the intersecting part of the conducting line 13 and 14, forming a transistor, and the conducting lines 13, 14 and the conductors 15 normally independent (i.e., to be formed separately) in order to enable each transistor to work independently.

In the fabrication of electronic components, it is normally separating the substrate 16 into a plurality of cells 17, using masks to form electronic components in a certain cell 17, repeating the procedure above for other cells 17, cutting the substrate 16, and finally packaging each cell 17 individually. Obviously, masks being used to transfer the patterns needed (for example, the pattern of a gate, a drain or a source electrode) onto the cells 17, the properties of the electronic components forming in each cell 17 will be different if the alignment of the masks is not precise, wherein the alignment error may arise from the error of the same mask aligned with different cell 17 incorrectly or different masks aligned with the same cell 17 inexactly.

Figure 1B:
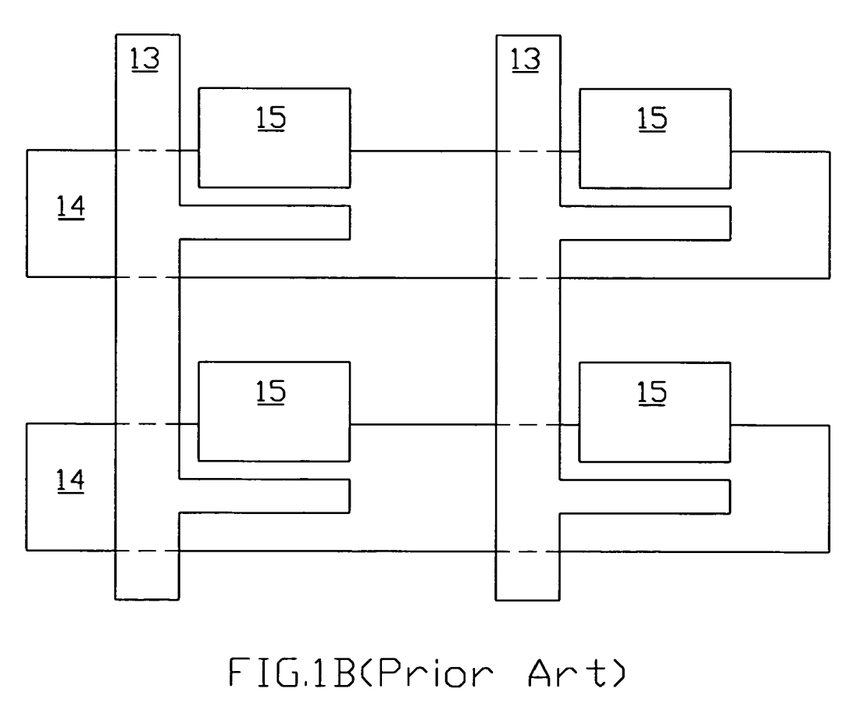
Figure 1C:
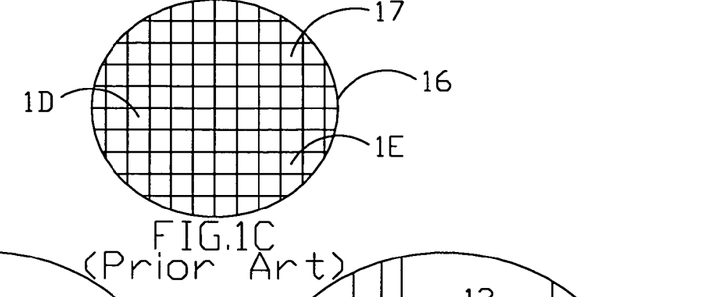
Figure 1D:
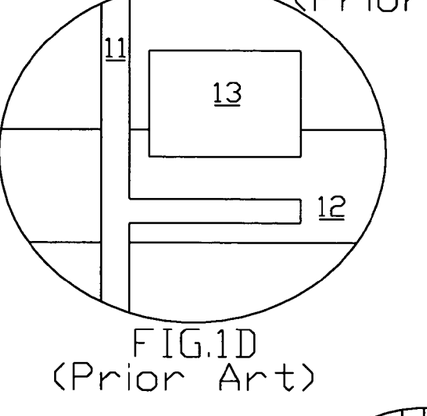
Figure 1E:
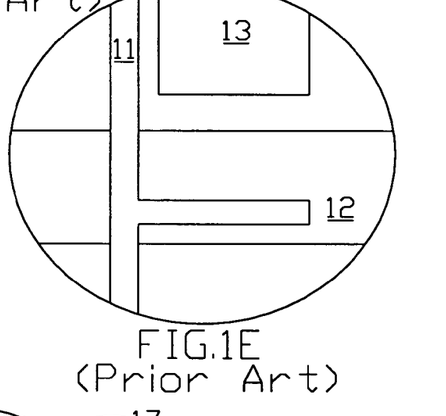
Figures 1F, 1G, 1H:
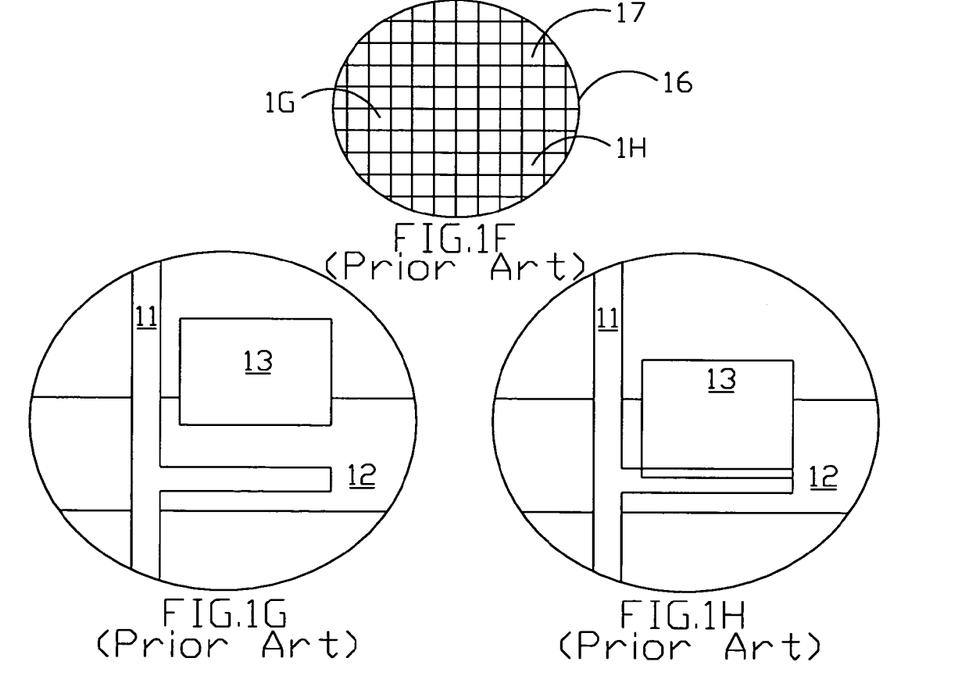

To see how this could happen especially when many masks needed, take the case shown in FIG. 1B for example. If the alignment error of the mask of the gate, the drain, and the source electrode in separate cells 17 are different, as shown in FIG. 1C to 1H, the overlap between the gate and the drain electrode will be different in separate cells 17, resulting in different gate-drain capacitors (Cgd) and/or gate-source capacitors (Cgs), and therefore different properties of the transistors in separate cells 17. If the transistor array as shown in these figures controls the pixel array of a display panel, for example, the different capacitors among the transistors will cause inhomogeneous brightness in separate areas of the display panel even the tone is setting the same, namely, the spot mura.

To solve the problem, a direct solution is to align more precisely at each time that the error is small enough to be neglected, but this raises the cost and technology level needed. Hence, the well-known art normally solves the problem from another respect: to modify the pattern of the gate, the drain, and the source electrode such that the variation resulted from the alignment error is small enough to be neglected. For example, increase the area of the gate electrode to increase the gate electrode capacitor (Cs), to reduce the variation of the transistor operating voltage involved with the different gate-drain and gate-source capacitors; or modify the pattern of the drain electrode to reduce the variation of the gate-drain capacitor.

Whereas the well known art is either to increase the area of the transistor, which is contravening to lightness and smallness, or to reduce the variation to some extent that is not satisfactory. Accordingly it is necessary to modify further the layout of the transistor array shown in FIG. 1B to assure the properties of the transistors not affected by alignment error.

SUMMARY OF THE INVENTION

An object of the present invention is to keep the property of a transistor array by keeping the overlap area between the gate and the drain electrode fixed even in the presence of the alignment error of the gate and the drain mask, without changing the exposure procedure and limiting the forming process of the transistor array.

Another object of the present invention is to provide a transistor array that can easily free from the effect of poor transistors.

The transistor provided in the present invention, or alternatively, each transistor in the transistor array provided in the present invention, owns at least one of the following features:

First, the gate electrode projects from the conducting line of the gate electrode, making the whole transistor outside the conducting line of the gate electrode connecting the gate electrodes. Therefore if there is a problem with a transistor, the gate electrode of that transistor can be cut, and the source and the drain electrode of that transistor can be short, to avoid influence from that poor transistor on normal transistors.

Second, if the present invention is applied to a thin film transistor (TFT), the projection of the semiconductor layer onto the substrate is completely inside that of the gate electrode, resulting in a large decrement in the leakage current caused from the lighting upon the semiconductor layer and therefore a better performance of the transistor.

Third, the drain electrode transversely strides across the gate electrode, the projection of the overlap between the drain and the gate electrode onto the substrate completely inside that of the gate electrode. Hence, even an alignment error between the gate electrode mask and the drain electrode mask occurs, the variation of the gate-drain capacitor is not apparent as long as the alignment error doesn't change the overlap area substantially.

Fourth, the gate electrode, the conducting line of the gate electrode, and the distance between the drain and the source electrode reduce the variation of the gate-drain capacitor and the gate-source capacitor arising from the alignment error of the masks of the gate, the drain, and the source electrode to a minimum. Briefly, that is to prevent the overlap area from changing apparently with the alignment error, or in other words, to prevent the area that is not overlapped from overlapping with the alignment error.

DESCRIPTION OF THE PREFERRED EMBODIMENT

At first it is emphasized that the description hereafter is only to demonstrate and illustrate some preferred embodiments of the present invention, unless proclaimed in writing, the transistor (or the transistor array) provided in the present invention is not limited to details such as the shape of any component, the relative angle, the relative distance, and the relative position by the description hereafter. Furthermore any possible variation and modification of the preferred embodiments described below is made independently and can be mixed if needed unless a dependent condition is proclaimed in writing.

Figure 2A:
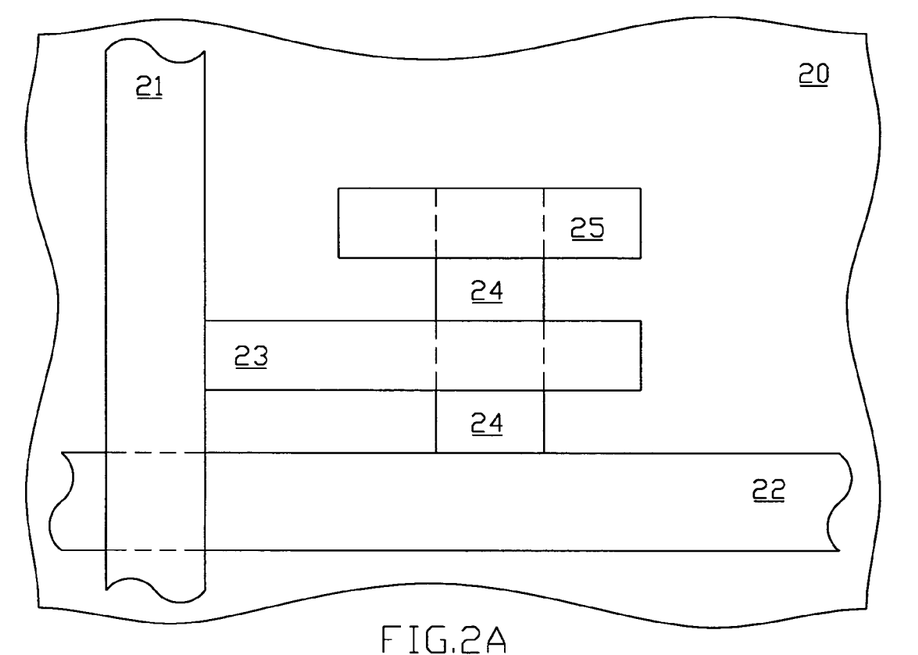
FIG. 2A to 2H showing some variation and modification of a preferred embodiment of the present invention.
Figure 2B:
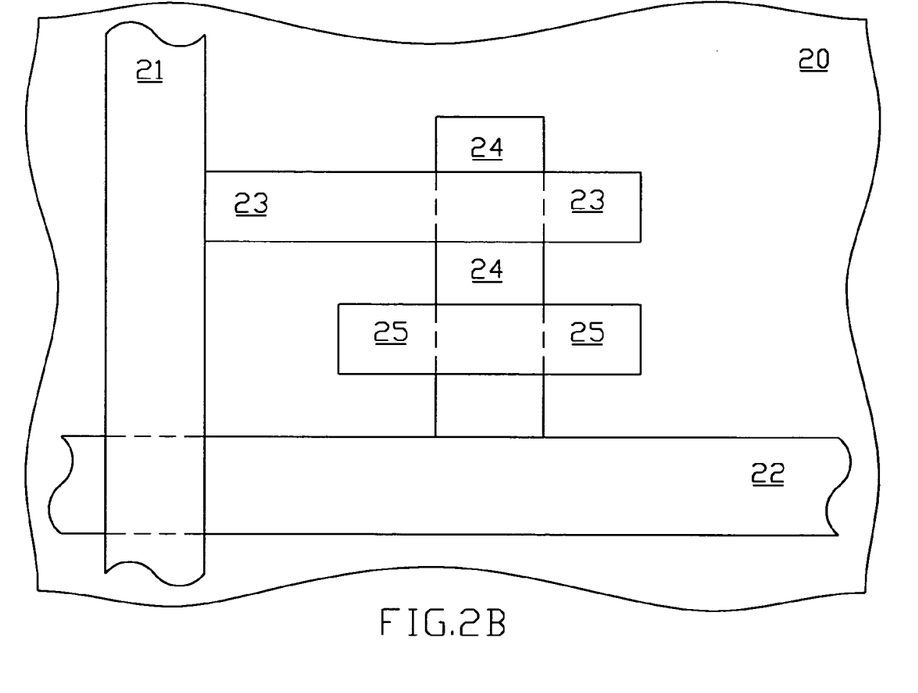

A preferred embodiment of the present invention is a transistor as shown in FIGS. 2A and 2B comprising at least a first conducting structure 21, a second conducting structure 22, a third conducting structure 23, a fourth conducting structure 24, and a fifth conducting structure 25. The first conducting structure 21 and the third conducting structure 23 correspond to the source electrode. The second conducting structure 22 and the fourth conducting structure 24 correspond to the gate electrode. The fifth conducting structure corresponds to the drain electrode.

As shown in FIGS. 2A and 2B, the first conducting structure 21 is formed upon the substrate 20, as well as the second conducting structure 22 does. The projection of the second conducting structure 22 being onto the substrate 20 intersects the projection of the first conducting structure 21 being onto the substrate 20. The third conducting structure 23 is formed upon the substrate 20 and contacts with the first conducting structure 21. The projection of the third conducting structure 23 being onto the substrate 20 is separated from the projection of the second conducting structure 22 being onto the substrate 20. The fourth conducting structure 24 is formed upon the substrate 20 and contacts with the second conducting structure 22. The projection of the fourth conducting structure 24 being onto the substrate 20 is separated from the projection of the first conducting structure 21. The projection of the fourth conducting structure 24 intersects the projection of the third conducting structure 23. The fifth conducting structure 25 is formed upon the substrate 20. The projection of the fifth conducting structure 25 being onto the substrate 20 at least partially overlaps the projection of the fourth conducting structure 24, and is completely separated from the projections of the third conducting structure 23, the first conducting structure 21, and the second conducting structure 22.

Obviously, a main feature of this preferred embodiment lets the fifth conducting structure 25, i.e. the drain electrode, transversely across the fourth conducting structure 24, i.e. the gate electrode, to efficiently diminish the overlap area from the variation due to the alignment error. As a result, the relative position between the fourth conducting structure 24 and the fifth conducting structure 25 is not strictly limited in this preferred embodiment. Generally, the projections of the fifth conducting structure 25 and the second conducting structure 22 lie on the opposite side of the projection of the third conducting structure 23 to form a conducting line, i.e. a metal contact, to connect with the drain electrode and prevent from a short circuit.

Apparently, another feature of this preferred embodiment lets the third conducting structure 23, i.e. the source electrode, and the fourth conducting structure 24, the gate electrode, be formed outside of the first conducting structure 21, i.e. the conducting line of the source electrode, and the second conducting structure 22, the conducting line of the gate electrode. If a poor transistor results from the alignment error, the gate electrode would be separated by a laser cutting or otherwise. After the gate electrode is separated, the transistor cannot be affected by the gate conducting structure, and then be affected by the drain and the source electrode to avoid apparent influence of the poor transistor on the current between the drain and the source electrode. Certainly, both the gate electrode and the source electrode could be completely separated by a laser cutting to isolate the influence of the poor transistor. Whether conducting structure to be cut depends on the actual layout of the transistor array (or the whole electronic component, for example, the thin film transistor array and the pixel array of a thin film plasma display panel), and is not limited to this preferred embodiment.

Figure 2C:
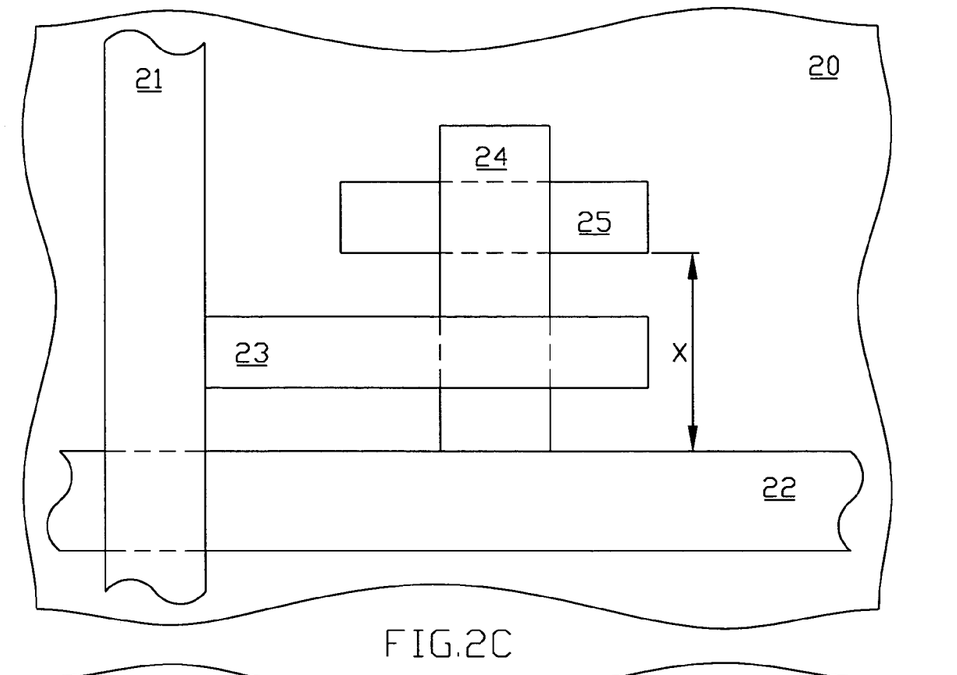

Furthermore, for diminishing the influence of the relative displaced position between the gate electrode and the drain electrode that on the gate-drain capacitor, the projection of the fifth conducting structure 25 is separated from the projection of the second conducting structure 22, as shown in FIG. 2C. The projection of the fifth conducting structure 25 and the projection of the second conducting structure 22 lie on the opposite side of the projection of the third conducting structure 23. Besides, the relative distance X between the projection of the fourth conducting structure 24 and the second conducting structure 22 depends on the alignment error distance Z which is not shown in figures in actual process. The relative distance X is equal to or larger than the largest alignment error distance Z between the drain electrode mask and the gate electrode mask.

Figure 2D:
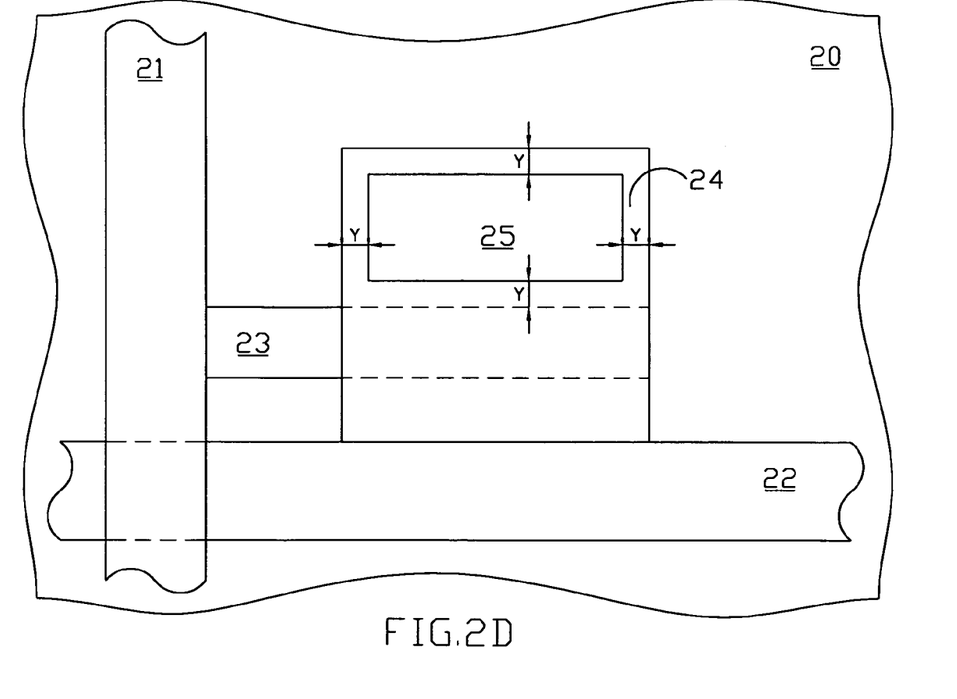

As shown in FIG. 2D, another variation of the preferred embodiment lets the fifth conducting structure 25 completely be formed inside the projection of the fourth conducting structure 24 to keep the displaced position of the fifth conducting structure 25 inside the projection of the fourth conducting structure 24. Certainly, to keep the overlap area from changing, the relative distance Y between the projection of the fifth conducting structure 25 and each side of the projection of the fourth conducting structure 24 has to be equal to or larger than the largest alignment error distance Z along the direction of the first conducting structure 21.

Figure 2E:
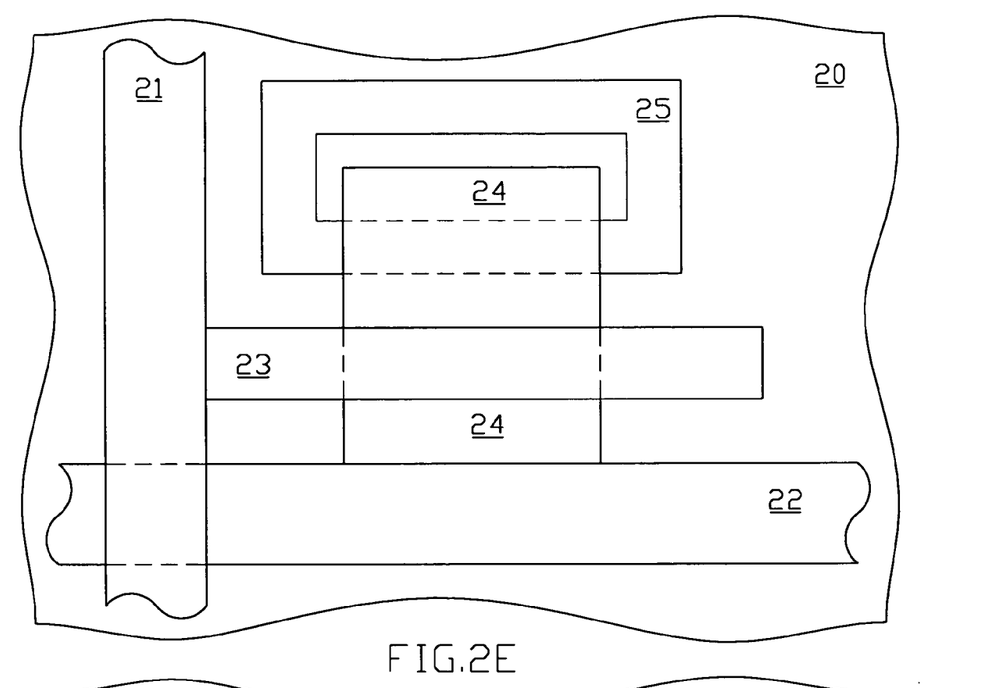

Furthermore, as shown in FIG. 2E, when the projection of the fifth conducting structure 25 is not completely formed inside the projection of the fourth conducting structure 24, the projection of the fifth conducting structure 25 doesn't contact with the end of the projection of the fourth conducting structure 24 that away from the projection of the second conducting structure 22.

Figure 2F:
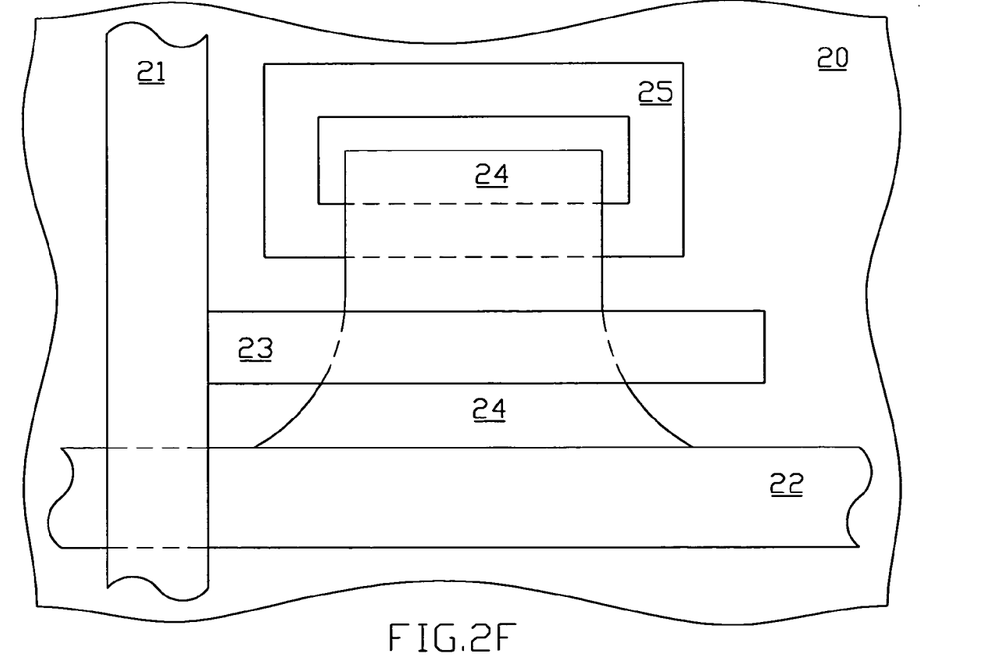
Figure 2G:
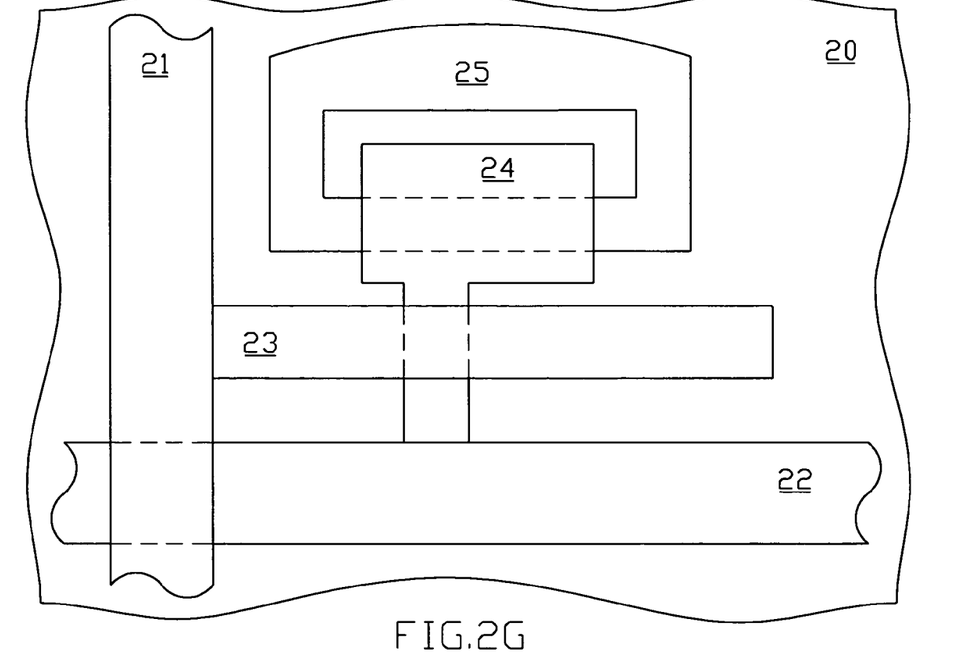

Besides, to prevent an apparent change in the area of the capacitor from the alignment error, as shown in FIGS. 2F and 2G, the shape of the projection of the fourth conducting structure 24 and the shape of the projection of the fifth conducting structure 25 may be approximately a parallelogram.

Figure 2H:
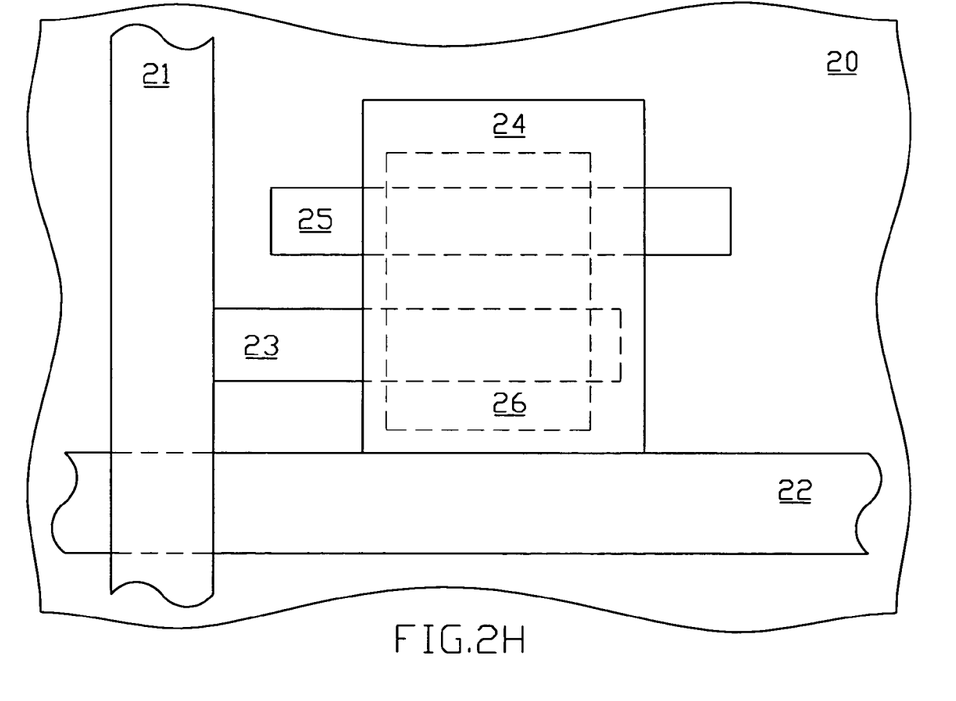

In addition, if the present invention is applied to a transistor with its substrate 20 having a semiconductor layer 26, the semiconductor layer 26 may be formed upon the substrate 20 and electrically couples with the third conducting structure 23 and the fifth conducting structure 25 with the projection of the sixth conducting structure 26 onto substrate 20 totally inside the projection of the fourth conducting structure 24, as shown in FIG. 2H. By way of described above, the leakage current caused from light may be substantially declined for the declined probability that the semiconductor layer is lighted, and hence substantially declined the probability that the performance of a transistor lowered by the leakage current caused from light.

Figure 3A:
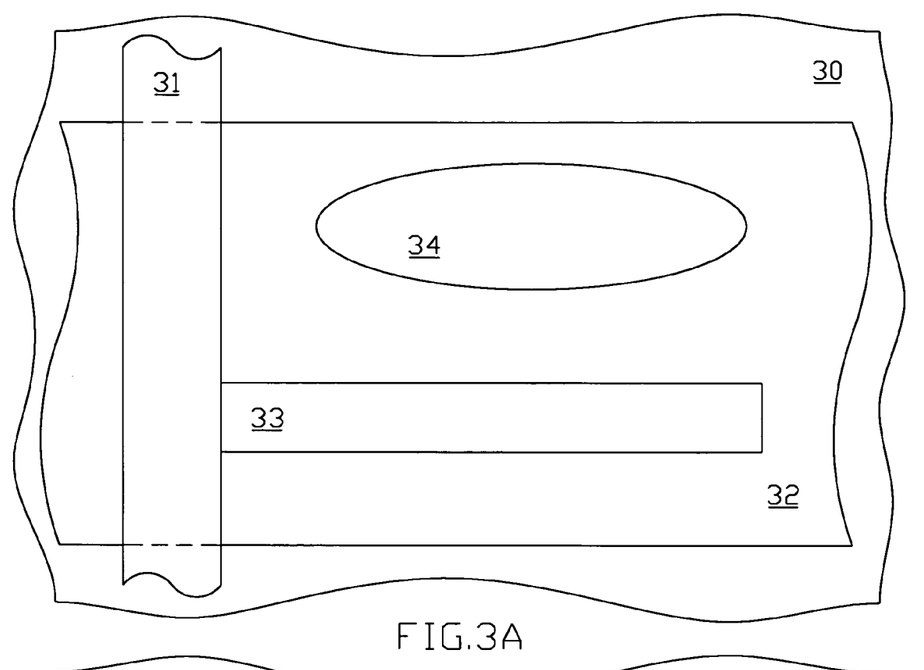
FIG. 3A to 3D showing some variation and modification of another preferred embodiment of the present invention.

Another preferred embodiment of the present invention is still a transistor, as shown in FIG. 3A, comprising at least a first conducting structure 31, a second conducting structure 32, a third conducting structure 33, and a fourth conducting structure 34, wherein the first conducting structure 31 and the third conducting structure 33 corresponding to the source electrode, the second conducting structure 32 corresponding to the gate electrode, and the fourth conducting structure 34 corresponding to the drain electrode.

As shown in FIG. 3A: the first conducting structure 31 and the second conducting structure 32 are upon the substrate 30, and the projection of the second conducting structure 32 intersects the projection of the first conducting structure 31. The third conducting structure 33 is upon the substrate 30 and contacts with the first conducting structure 31, with the projection of the third conducting structure 33 onto substrate 30 completely inside the projection of the second conducting structure 32. The fourth conducting structure 34 is formed upon the substrate 30. The projection of the fourth conducting structure 34 onto substrate 30 is separated from the projections of the third conducting structure 33 and the first conducting structure 31. The projection of the fourth conducting structure 34 is completely formed inside the projection of the second conducting structure 32. The projection of the fourth conducting structure 34 approximately parallels to the projection of the third conducting structure 33.

Obviously, the feature of the preferred embodiment is that the fourth conducting structure 34 as the drain electrode totally overlaps the second conducting structure 32 as the gate electrode. The projection of the fourth conducting structure 34 is completely inside the projection of the second conducting structure 32. As a result, the relative area of the gate and the drain electrode remains constant as long as the projection of the fourth conducting structure 34 is completely inside the projection of the second conducting structure 32.

Although the preferred embodiment makes no use of gate electrode to cut poor transistors from others as the former preferred embodiment, it can improve/prevent any defect resulted from the variation of the gate-drain capacitor, for example, the spot mura in a TFT liquid crystal display, by assuring the gate-drain capacitor constant.

Figure 3B:
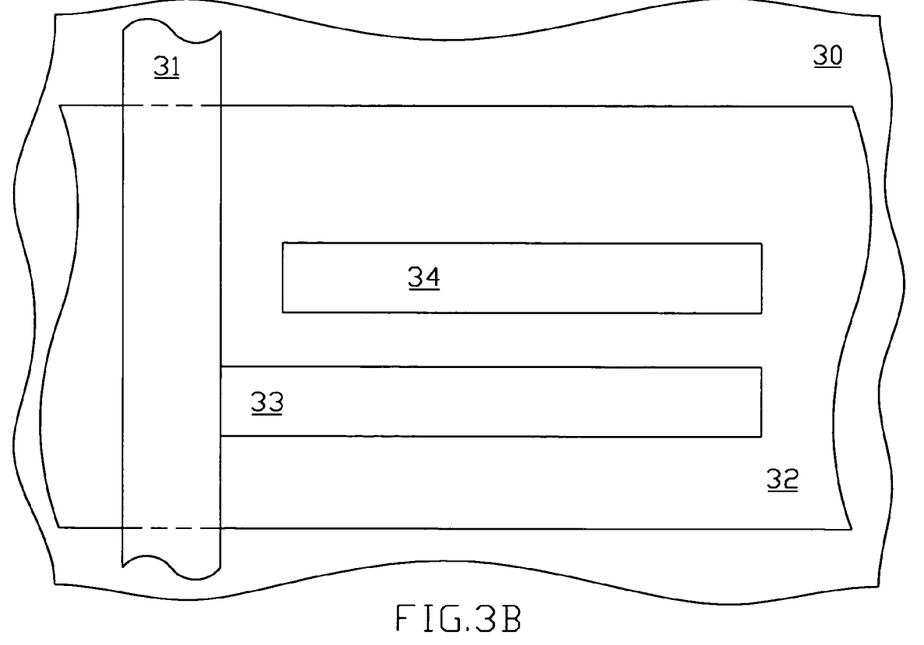

Further, to prevent the overlap between the gate and the drain electrode from being affected by the relative displaced position of the gate and the drain electrode as possible, as shown in FIG. 3B, the side of the projection of the fourth conducting structure 34 approximately parallel to the projection of the third conducting structure 33 may be far longer, say, 7 times for example, than the side of the projection of the fourth conducting structure 34 approximately parallel to the projection of the first conducting structure 31.

Figure 3C:
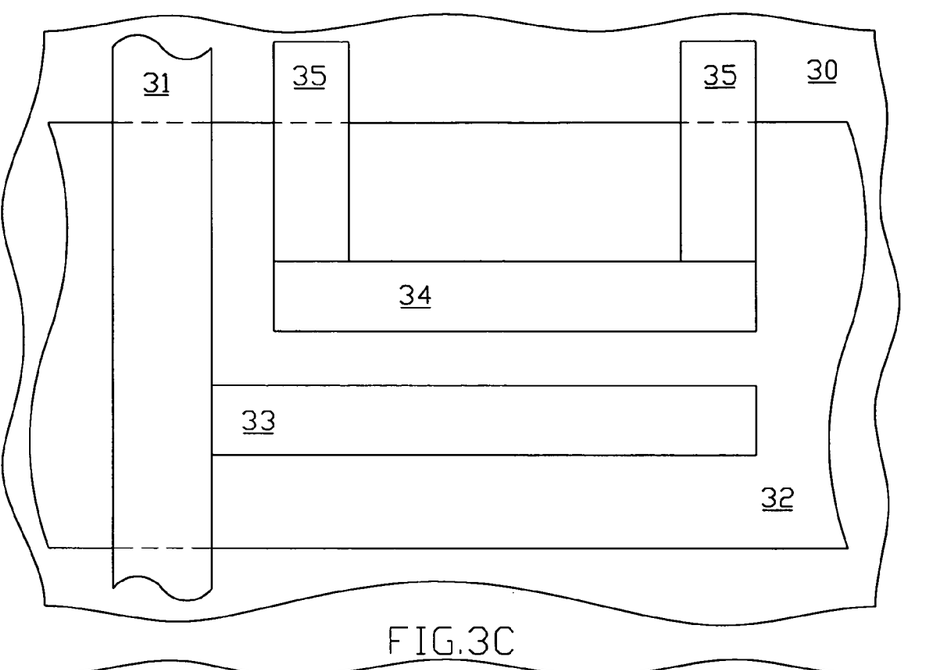

As shown in FIG. 3C, the preferred embodiment may further comprises a fifth conducting structure 35 upon the substrate 30 and contacting with the fourth conducting structure 34 (together forming the drain electrode), the projection of the fifth conducting structure 35 onto the substrate 30 separated from the projection of the third conducting structure 33 and the projection of the first conducting structure 31, at least part of the projection of the fifth conducting structure 35 inside the projection of the second conducting structure 32, the projection of the fifth conducting structure 35 and the projection of the third conducting structure 33 on opposite sides of the projection of the fourth conducting structure 34 respectively, and only part of the side of the projection of the fourth conducting structure 34 facing the projection of the fifth conducting structure 35 contacting with the projection of the fifth conducting structure 35.

By doing so makes the conducting line (plug) connecting with the drain electrode easily formed, but also increase the probability that the gate-drain capacitor changes with the alignment error. Then, the area of the projection of the fourth conducting structure 34 is better far larger than the overlap between the projection of the fifth conducting structure 35 and the projection of the second conducting structure 32, to reduce the effect of the variation of the overlap between the projection of the fifth conducting structure 35 and the projection of the second conducting structure 32 resulted from the alignment error.

Figure 3D:
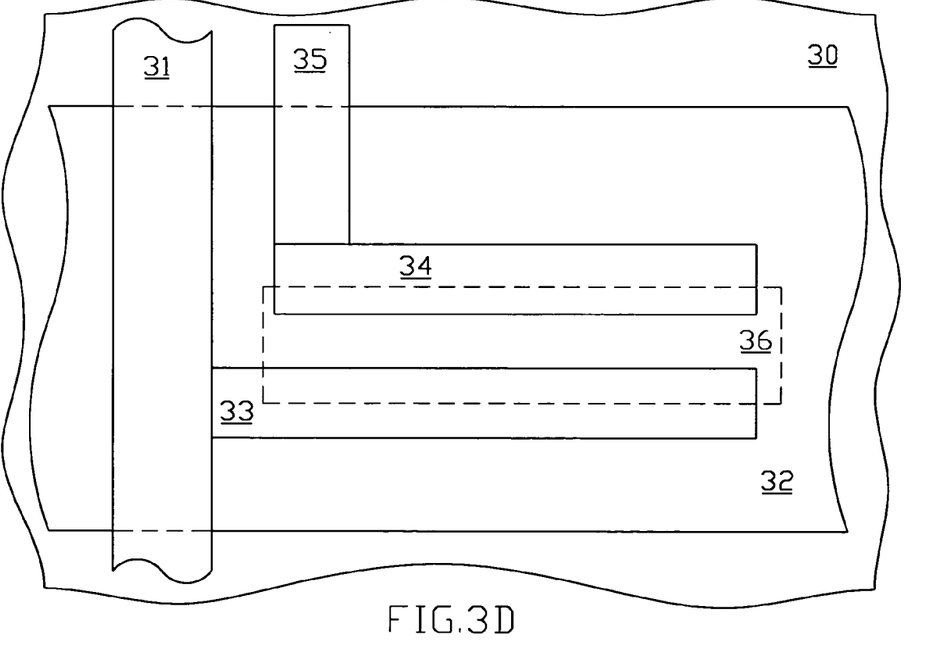

In addition, if the present invention is applied to a transistor with its substrate 30 having a semiconductor layer 36, the semiconductor layer 36 may be upon the substrate 30 and electrically couples with the third conducting structure 33 and the fourth conducting structure 34 with the projection of the semiconductor layer 36 onto substrate 30 totally inside the projection of the second conducting structure 32, as shown in FIG. 3D. By way of the description above, the leakage current caused from light may be substantially declined for the declined probability that the semiconductor layer 36 is lighted, and hence substantially declined the probability that the performance of a transistor lowered by the leakage current caused light.

Figure 4:
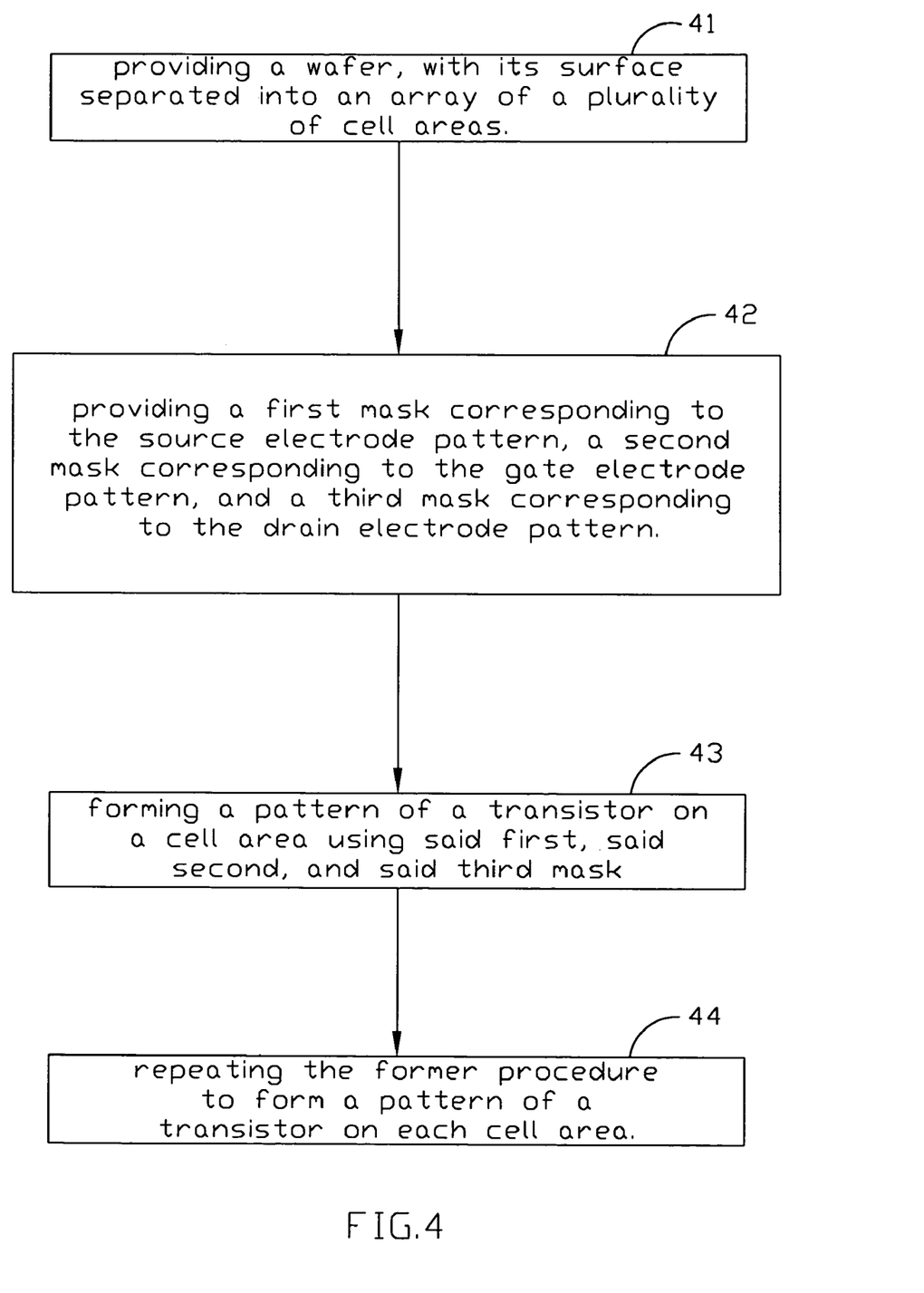
FIG. 4 showing the flow chart of a further preferred embodiment of the present invention.

A further preferred embodiment of the present invention is a method forming transistors, as shown in FIG. 4, comprising at least the following basic procedures:

As shown in the background block 41, providing a wafer, with its surface separated into an array of a plurality of cell areas;

As shown in the preparation block 42, providing a first mask corresponding to the source electrode pattern, a second mask corresponding to the gate electrode pattern, and a third mask corresponding to the drain electrode pattern. The pattern of the first mask comprises a first line-shaped pattern and a first block-shaped pattern aside and contacts with said first line-shaped pattern. The pattern of the second mask comprises a second line-shaped pattern and a second block-shaped pattern aside and contacts with said second line-shaped pattern. The pattern of the third mask is a ring-shaped pattern.

As shown in the pattern transfer block 43, forming a pattern of a transistor on a cell area using said first, said second, and said third mask;

As shown in the pattern transfer repetition block 44, repeating the former procedure to form a pattern of a transistor on each cell area.

It is emphasized that the pattern of the transistor must satisfy:

(1) The pattern of the first mask partly overlapes the pattern of the second mask, resulting in that the first line-shaped pattern partly overlaps the second line-shaped pattern, the first block-shaped pattern partly overlaps the second block-shaped pattern, the first line-shaped pattern is completely separated from the second block-shaped pattern, and the second line-shaped pattern is completely separated from the first block-shaped pattern.

(2) The pattern of the first mask is completely separated from the pattern of the third mask.

(3) The pattern of the second mask partly overlaps the pattern of the third mask, resulting in that the ring-shaped pattern partly overlaps the second block-shaped pattern and the ring-shaped pattern is completely separated from the second line-shaped pattern. The overlap between the ring-shaped pattern and the second block-shaped pattern and the contacting part of the second line-shaped pattern and the second block-shaped pattern are set on the opposite sides of the overlap between the first block-shaped pattern and the second block-shaped pattern.

Besides, in normal fabrication, with the alignment error of any mask along the direction of the first line-shaped pattern, say, the first displaced position, and the alignment error of any mask along the direction of the second line-shaped pattern, say, the second displaced position, the pattern of the transistor must satisfy:

(1) if the overlap between the ring-shaped and the second block-shaped pattern being the first part pattern, then the distance between the side of said first part pattern facing said second block-shaped pattern and said second block-shaped pattern being larger than said first displaced position, the distance between said side of said first part pattern facing said second block-shaped pattern and said second line-shaped pattern being larger than said first displaced position, and the distance between the side of said first block-shaped pattern facing said second line-shaped pattern and said second line-shaped pattern being larger than said first displaced position;

(2) the distance between the side of said second block-shaped pattern facing said first line-shaped pattern and said first line-shaped pattern being larger than said second displaced position, and the distance between the side of said ring-shaped pattern facing said first line-shaped pattern and said first line-shaped pattern being larger than said second displaced position;

(3) if said ring-shaped pattern having a second part pattern and a third part pattern both approximately parallel to said first line-shaped pattern, then the distance between said second part pattern and said second block-shaped pattern being larger than said second displaced position, and the distance between said third part pattern and said second block-shaped pattern being larger than said second displaced position.

Surely, while the transistor is a thin film transistor etc., the procedure further comprises forming the pattern of the semiconductor layer as part of the pattern of the transistor. In this case the pattern of the semiconductor layer electrically couples with the first block-shaped and the second block-shaped pattern and is completely located inside the ring-shaped pattern.

The described above is only of some preferred embodiments of the present invention, and not to limit the scope of the claims of the present invention; and any equivalent variation and modification in light of the present invention should be within the scope of the claims hereafter.

What is claimed is:

1. A transistor, composing,
    a first conducting structure upon a substrate;
    a second conducting structure upon said substrate, with the projection of said second conducting structure onto said substrate intersecting the projection of said first conducting structure onto said substrate;
    a third conducting structure upon said substrate contacting with said first conducting structure, with the projection of said third conducting structure onto said substrate completely inside said projection of said second conducting structure onto said substrate; and
    a fourth conducting structure upon said substrate, with the projection of said fourth conducting structure onto said substrate separated from said projection of said first and said third conducting structure onto said substrate, said projection of said fourth conducting structure onto said substrate completely inside said projection of said second conducting structure onto said substrate; and said projection of said fourth conducting structure onto said substrate approximately parallel to said projection of said third conducting structure onto said substrate at least seven times longer than said side of said projection of said fourth conducting structure onto said substrate approximately parallel to said projection of said first conducting structure onto said substrate.

2. The transistor as set forth in claim 1, wherein the side of said projection of said fourth conducting structure onto said substrate approximately parallel to said projection of said third conducting structure onto said substrate far longer than the side of said projection of said fourth conducting structure onto said substrate approximately parallel to said projection of said first conducting structure onto said substrate.

3. The transistor as set forth in claim 1, further comprising a fifth conducting structure upon said substrate contacting with said fourth conducting structure, with the projection of said fifth conducting structure onto said substrate separated from said projection of said first and said third conducting structure onto said substrate, said projection of said fifth conducting structure onto said substrate at least partly inside said projection of said second conducting structure onto said substrate, said projection of said fifth and said third conducting structure onto said substrate on the opposite sides of said projection of said fourth conducting structure onto said substrate, and the side of said projection of said fourth conducting structure onto said substrate facing said projection of said fifth conducting structure onto said substrate only partly contacting with said projection of said fifth conducting structure onto said substrate.

4. The transistor as set forth in claim 3, wherein the area of said projection of said fourth conducting structure onto said substrate far larger than that of the overlap between said projection of said fifth and said second conducting structure.

5. The transistor as set forth in claim 1, further comprising a semiconductor layer upon said substrate electrically coupling with said third and said fourth conducting structure, with the projection of said semiconductor layer onto said substrate completely inside said projection of said second conducting structure onto said substrate.

* * * * *